(12) United States Patent
Perera et al.

(10) Patent No.: US 9,129,855 B2
(45) Date of Patent: Sep. 8, 2015

(54) NON-VOLATILE MEMORY (NVM) AND HIGH-K AND METAL GATE INTEGRATION USING GATE-FIRST METHODOLOGY

(71) Applicant: FREESCALE SEMICONDUCTOR, INC., Austin, TX (US)

(72) Inventors: Asanga H. Perera, West Lake Hills, TX (US); Cheong Min Hong, Austin, TX (US); Sung-Taeg Kang, Austin, TX (US); Jane A. Yater, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 29 days.

(21) Appl. No.: 14/041,647

(22) Filed: Sep. 30, 2013

(65) Prior Publication Data

US 2015/0091079 A1 Apr. 2, 2015

(51) Int. Cl.

| | | |
|---|---|---|
| *H01L 21/336* | (2006.01) | |
| *H01L 27/115* | (2006.01) | |
| *H01L 21/28* | (2006.01) | |
| *H01L 29/423* | (2006.01) | |
| *H01L 29/66* | (2006.01) | |
| *H01L 29/788* | (2006.01) | |

(52) U.S. Cl.
CPC .... *H01L 27/11524* (2013.01); *H01L 21/28282* (2013.01); *H01L 27/11529* (2013.01); *H01L 27/11534* (2013.01); *H01L 29/42332* (2013.01); *H01L 29/66825* (2013.01); *H01L 29/7887* (2013.01)

(58) Field of Classification Search
CPC .............................................. H01L 21/823456

USPC .......................................................... 438/267
See application file for complete search history.

(56) References Cited

U.S. PATENT DOCUMENTS

| | | | |
|---|---|---|---|
| 5,614,746 | A | 3/1997 | Hong et al. |
| 6,087,225 | A | 7/2000 | Bronner et al. |
| 6,194,301 | B1 | 2/2001 | Radens et al. |
| 6,235,574 | B1 | 5/2001 | Tobben et al. |
| 6,333,223 | B1 | 12/2001 | Moriwaki et al. |
| 6,388,294 | B1 | 5/2002 | Radens et al. |
| 6,509,225 | B2 | 1/2003 | Moriwaki et al. |
| 6,531,734 | B1 | 3/2003 | Wu |

(Continued)

FOREIGN PATENT DOCUMENTS

WO        2009058486        5/2009

OTHER PUBLICATIONS

Office Action mailed Nov. 22, 2013 in U.S. Appl. No. 13/780,591.

(Continued)

*Primary Examiner* — Chandra Chaudhari

(57) ABSTRACT

A method of making a semiconductor structure includes forming a select gate over a substrate in an NVM portion and a first protection layer over a logic portion. A control gate and a storage layer are formed over the substrate in the NVM portion, wherein the control and select gates have coplanar top surfaces. The charge storage layer is under the control gate, along adjacent sidewalls of the select gate and control gate, and is partially over the top surface of the select gate. A second protection layer is formed over the NVM portion and the logic portion. The second protection layer and the first protection layer are removed from the logic portion leaving a portion of the second protection layer over the control gate and the select gate. A gate structure is formed over the logic portion comprising a high k dielectric and a metal gate.

18 Claims, 11 Drawing Sheets

(56) References Cited

U.S. PATENT DOCUMENTS

| | | |
|---|---|---|
| 6,635,526 B1 | 10/2003 | Malik et al. |
| 6,707,079 B2 | 3/2004 | Satoh et al. |
| 6,777,761 B2 | 8/2004 | Clevenger et al. |
| 6,785,165 B2 | 8/2004 | Kawahara et al. |
| 6,939,767 B2 | 9/2005 | Hoefler et al. |
| 7,154,779 B2 | 12/2006 | Mokhlesi et al. |
| 7,183,159 B2 | 2/2007 | Rao et al. |
| 7,190,022 B2 | 3/2007 | Shum et al. |
| 7,202,524 B2 | 4/2007 | Kim et al. |
| 7,208,793 B2 | 4/2007 | Bhattacharyya |
| 7,256,125 B2 | 8/2007 | Yamada et al. |
| 7,271,050 B2 | 9/2007 | Hill |
| 7,365,389 B1 | 4/2008 | Jeon et al. |
| 7,391,075 B2 | 6/2008 | Jeon et al. |
| 7,402,493 B2 | 7/2008 | Oh et al. |
| 7,405,968 B2 | 7/2008 | Mokhlesi et al. |
| 7,439,134 B1 | 10/2008 | Prinz et al. |
| 7,476,582 B2 | 1/2009 | Nakagawa et al. |
| 7,521,314 B2 | 4/2009 | Jawarani et al. |
| 7,524,719 B2 | 4/2009 | Steimle et al. |
| 7,544,490 B2 | 6/2009 | Ferrari et al. |
| 7,544,980 B2 | 6/2009 | Chindalore et al. |
| 7,544,990 B2 | 6/2009 | Bhattacharyya |
| 7,560,767 B2 | 7/2009 | Yasuda et al. |
| 7,795,091 B2 | 9/2010 | Winstead et al. |
| 7,799,650 B2 | 9/2010 | Bo et al. |
| 7,816,727 B2 | 10/2010 | Lai et al. |
| 7,821,055 B2 | 10/2010 | Loiko et al. |
| 7,906,396 B1 | 3/2011 | Chiang et al. |
| 7,932,146 B2 | 4/2011 | Chen et al. |
| 7,989,871 B2 | 8/2011 | Yasuda |
| 7,999,304 B2 | 8/2011 | Ozawa et al. |
| 8,017,991 B2 | 9/2011 | Kim et al. |
| 8,043,951 B2 | 10/2011 | Beugin et al. |
| 8,063,434 B1 | 11/2011 | Polishchuk et al. |
| 8,093,128 B2 | 1/2012 | Koutny et al. |
| 8,138,037 B2 | 3/2012 | Chudzik et al. |
| 8,168,493 B2 | 5/2012 | Kim |
| 8,298,885 B2 | 10/2012 | Wei et al. |
| 8,334,198 B2 | 12/2012 | Chen et al. |
| 8,372,699 B2 | 2/2013 | Kang et al. |
| 8,389,365 B2 | 3/2013 | Shroff et al. |
| 8,399,310 B2 | 3/2013 | Shroff et al. |
| 8,524,557 B1 | 9/2013 | Hall et al. |
| 8,536,006 B2 | 9/2013 | Shroff et al. |
| 8,536,007 B2 | 9/2013 | Shroff et al. |
| 8,647,946 B2 * | 2/2014 | Tan et al. ............... 438/261 |
| 8,679,927 B2 | 3/2014 | Ramkumar et al. |
| 2001/0049166 A1 | 12/2001 | Peschiaroli et al. |
| 2002/0061616 A1 | 5/2002 | Kim et al. |
| 2003/0022434 A1 | 1/2003 | Taniguchi et al. |
| 2004/0075133 A1 | 4/2004 | Nakagawa et al. |
| 2004/0262670 A1 | 12/2004 | Takebuchi et al. |
| 2005/0145949 A1 | 7/2005 | Sadra et al. |
| 2006/0038240 A1 | 2/2006 | Tsutsumi et al. |
| 2006/0046449 A1 | 3/2006 | Liaw |
| 2006/0099798 A1 | 5/2006 | Nakagawa |
| 2006/0134864 A1 | 6/2006 | Higashitani et al. |
| 2006/0211206 A1 | 9/2006 | Rao et al. |
| 2006/0221688 A1 | 10/2006 | Shukuri et al. |
| 2007/0037343 A1 | 2/2007 | Colombo et al. |
| 2007/0077705 A1 | 4/2007 | Prinz et al. |
| 2007/0115725 A1 | 5/2007 | Pham et al. |
| 2007/0215917 A1 | 9/2007 | Taniguchi |
| 2007/0224772 A1 | 9/2007 | Hall et al. |
| 2007/0249129 A1 | 10/2007 | Hall et al. |
| 2007/0264776 A1 | 11/2007 | Dong et al. |
| 2008/0029805 A1 | 2/2008 | Shimamoto et al. |
| 2008/0050875 A1 | 2/2008 | Moon et al. |
| 2008/0067599 A1 | 3/2008 | Tsutsumi et al. |
| 2008/0105945 A1 | 5/2008 | Steimle et al. |
| 2008/0121983 A1 | 5/2008 | Seong et al. |
| 2008/0128785 A1 | 6/2008 | Park et al. |
| 2008/0145985 A1 | 6/2008 | Chi |
| 2008/0185635 A1 | 8/2008 | Yanagi et al. |
| 2008/0237690 A1 | 10/2008 | Anezaki et al. |
| 2008/0237700 A1 | 10/2008 | Kim et al. |
| 2008/0283900 A1 | 11/2008 | Nakagawa et al. |
| 2008/0290385 A1 | 11/2008 | Urushido |
| 2008/0308876 A1 | 12/2008 | Lee et al. |
| 2009/0050955 A1 | 2/2009 | Akita et al. |
| 2009/0065845 A1 | 3/2009 | Kim et al. |
| 2009/0072274 A1 | 3/2009 | Knoefler et al. |
| 2009/0078986 A1 | 3/2009 | Bach |
| 2009/0101961 A1 | 4/2009 | He et al. |
| 2009/0111226 A1 | 4/2009 | Chindalore |
| 2009/0111229 A1 | 4/2009 | Steimle et al. |
| 2009/0179283 A1 | 7/2009 | Adams et al. |
| 2009/0225602 A1 | 9/2009 | Sandhu et al. |
| 2009/0256211 A1 | 10/2009 | Booth, Jr. et al. |
| 2009/0269893 A1 | 10/2009 | Hashimoto et al. |
| 2009/0273013 A1 | 11/2009 | Winstead et al. |
| 2009/0278187 A1 | 11/2009 | Toba |
| 2011/0031548 A1 | 2/2011 | White et al. |
| 2011/0095348 A1 | 4/2011 | Chakihara et al. |
| 2011/0204450 A1 | 8/2011 | Moriya |
| 2011/0260258 A1 | 10/2011 | Zhu et al. |
| 2012/0034751 A1 | 2/2012 | Ariyoshi et al. |
| 2012/0104483 A1 | 5/2012 | Shroff et al. |
| 2012/0132978 A1 | 5/2012 | Toba et al. |
| 2012/0142153 A1 | 6/2012 | Jeong |
| 2012/0248523 A1 | 10/2012 | Shroff et al. |
| 2012/0252171 A1 | 10/2012 | Shroff et al. |
| 2013/0026553 A1 | 1/2013 | Horch |
| 2013/0037886 A1 | 2/2013 | Tsai et al. |
| 2013/0065366 A1 | 3/2013 | Thomas et al. |
| 2013/0084684 A1 | 4/2013 | Ishii et al. |
| 2013/0137227 A1 | 5/2013 | Shroff et al. |
| 2013/0171785 A1 | 7/2013 | Shroff et al. |
| 2013/0171786 A1 | 7/2013 | Shroff et al. |
| 2013/0178027 A1 | 7/2013 | Hall et al. |
| 2013/0178054 A1 | 7/2013 | Shroff et al. |
| 2013/0264633 A1 | 10/2013 | Hall et al. |
| 2013/0264634 A1 | 10/2013 | Hall et al. |
| 2013/0267072 A1 | 10/2013 | Hall et al. |
| 2013/0267074 A1 | 10/2013 | Hall et al. |
| 2013/0323922 A1 | 12/2013 | Shen et al. |
| 2014/0035027 A1 | 2/2014 | Chakihara et al. |
| 2014/0050029 A1 | 2/2014 | Kang et al. |
| 2014/0120713 A1 | 5/2014 | Shroff et al. |

OTHER PUBLICATIONS

Office Action mailed Dec. 24, 2013 in U.S. Appl. No. 13/790,225.
Office Action mailed Dec. 24, 2013 in U.S. Appl. No. 13/790,014.
Office Action mailed Dec. 31, 2013 in U.S. Appl. No. 13/442,142.
Office Action mailed Jan. 31, 2014 in U.S. Appl. No. 13/781,727.
Notice of Allowance mailed May 12, 2014 for U.S. Appl. No. 13/780,591 3 pages.
Notice of Allowance mailed Nov. 13, 2014 for U.S. Appl. No. 13/780,591 7 pages.
Non-Final Rejection mailed Dec. 26, 2014 for U.S. Appl. No. 13/661,157, 9 pages.
U.S. Appl. No. 14/195,299, filed Mar. 3, 2014, entitled "Method of Making a Logic Transistor and Non-Volatile Memory (NVM) Cell".
U.S. Appl. No. 14/228,682, filed Mar. 28, 2014, entitled "Method for Forming a Split-Gate Device".
U.S. Appl. No. 13/928,666, Hong, Office Action—Rejection, mailed Jul. 23, 2014.
U.S. Appl. No. 14/041,662, Perera, Office Action—Restriction, mailed Aug. 1, 2014.
U.S. Appl. No. 13/969,180, Perera, Office Action—Allowance, mailed Aug. 5, 2014.
U.S. Appl. No. 13/781,727, Shroff, Office Action—Allowance, mailed Aug. 15, 2014.
U.S. Appl. No. 13/955,665, Office Action—Allowance, mailed Aug. 20, 2014.
U.S. Appl. No. 13/973,549, Hong, Office Action—Restriction, mailed Aug. 26, 2014.
U.S. Appl. No. 13/441,426, Shroff, Office Action—Allowance, mailed Sep. 26, 2014.

(56) References Cited

OTHER PUBLICATIONS

U.S. Appl. No. 13/661,157, Office Action—Restriction, mailed Oct. 2, 2014.

U.S. Appl. No. 14/041,662, Perera, Office Action—Allowance, mailed Oct. 17, 2014.

Chen, J.H., et al., "Nonvolatile Flash Memory Device Using Ge Nanocrystals Embedded in HfAlO High-k Tunneling and Control Oxides: Device Fabrication and Electrical Performance", IEEE Transactions on Electron Devices, vol. 51, No. 11, Nov. 2004, pp. 1840-1848.

Kang, T.K., et al., "Improved characteristics for Pd nanocrystal memory with stacked HfAlO—SiO2 tunnel layer", Sciencedirect.com, Solid-State Electronics, vol. 61, Issue 1, Jul. 2011, pp. 100-105, http://wwww.sciencedirect.com/science/article/pii/S0038110111000803.

Krishnan, S., et al.., "A Manufacturable Dual Channel (Si and SiGe) High-K Metal Gate CMOS Technology with Multiple Oxides for High Performance and Low Power Applications", IEEE, Feb. 2011 IEEE International Electron Devices Meeting (IEDM), 28.1.1-28.1.4, pp. 634-637.

Lee, J.J., et al., "Theoretical and Experimental Investigation of Si Nanocrystal Memory Device with HfO2 High-K Tunneling Dielectric", IEEE Transactions on Electron Devices, vol. 50, No. 10, Oct. 2003, pp. 2067-2072.

Liu, Z., et al., "Metal Nanocrystal Memories—Part I: Device Design and Fabrication", IEEE Transactions on Electron Devices, vol. 49, No. 9, Sep. 2002, pp. 1606-1613.

Mao, P., et al., "Nonvolatile memory devices with high density ruthenium nanocrystals", Applied Physics Letters, vol. 93, Issue 24, Electronic Transport and Semiconductors, 2006.

Mao, P., et al., "Nonvolatile Memory Characteristics with Embedded high Density Ruthenium Nanocrystals", http://iopscience.iop.org/0256-307X/26/5/056104, Chinese Physics Letters, vol. 26, No. 5, 2009.

Pei, Y., et al., "MOSFET nonvolatile Memory with High-Density Cobalt-Nanodots Floating Gate and HfO2 High-k Blocking Dielectric", IEEE Transactions of Nanotechnology, vol. 10, No. 3, May 2011, pp. 528-531.

Wang, X.P., et al., Dual Metal Gates with Band-Edge Work Functions on Novel HfLaO High-K Gate Dielectric, IEEE, Symposium on VLSI Technology Digest of Technical Papers, 2006.

U.S. Appl. No. 13/402,426, Hall, M.D., et al., "Non-Volatile Memory Cell and Logic Transistor Integration", Office Action—Allowance—May 3, 2013.

U.S. Appl. No. 13/789,971, Hall, M.D., et al, "Integration Technique Using Thermal Oxide Select Gate Dielectric for Select Gate and Replacement Gate for Logic", Office Action—Allowance—May 15, 2013.

U.S. Appl. No. 13/491,771, Hall et al , "Integrating Formation of a Replacement Ggate Transistor and a Non-Volatile Memory Cell Using a High-K Dielectric", Office Action—Rejection, Sep. 9, 2013.

U.S. Appl. No. 13/442,142, Hall, M.D., et al., "Logic Transistor and Non-Volatile Memory Cell Integration", Office Action—Ex Parte Quayle, Apr. 4, 2013.

U.S. Appl. No. 13/442,142, Hall, M.D., et al., "Logic Transistor and Non-Volatile Memory Cell Integration", Office Action—Allowance, Aug. 2, 2013.

U.S. Appl. No. 13/907,491, Hall, M.D., et al., "Logic Transistor and Non-Volatile Memory Cell Integration", Office Action—Rejection, Sep. 13, 2013.

U.S. Appl. No. 12/915,726, Shroff, M., et al., "Non-Volatile Memory and Logic Circuit Process Integration", Office Action—Restriction, Jul. 31, 2012.

U.S. Appl. No. 12/915,726, Shroff, M., et al., "Non-Volatile Memory and Logic Circuit Process Integration", Office Action—Allowance, Dec. 10, 2012.

U.S. Appl. No. 13/781,727, Shroff, M., et al., "Methods of Making Logic Transistors and non-Volatile Memory Cells", Office Action—Rejection, Aug. 22, 2013.

U.S. Appl. No. 13/077,491, Shroff, M.., et al., "Non-Volatile Memory and Logic Circuit Process Integration", Office Action—Rejection, Aug. 15, 2012.

U.S. Appl. No. 13/077,491, Shroff, M.., et al., "Non-Volatile Memory and Logic Circuit Process Integration", Office Action—Rejection, Feb. 6, 2013.

U.S. Appl. No. 13/077,491, Shroff, M.., et al., "Non-Volatile Memory and Logic Circuit Process Integration", Office Action—Allowance, Jun. 18, 2013.

U.S. Appl. No. 13/077,501, Shroff, M.., et al., "Non-Volatile Memory and Logic Circuit Process Integration", Office Action—Allowance, Nov. 26, 2012.

U.S. Appl. No. 13/313,179, Shroff, M., et al., "Method of Protecting Against Via Failure and Structure Therefor", Office Action—Rejection, Aug. 15, 2013.

U.S. Appl. No. 13/307,719, Shroff, M., et al., "Logic and Non-Volatile Memory (NVM) Integration", Office Action—Allowance, May 29, 2013.

U.S. Appl. No. 13/343,331, Shroff, M., et al., "Non-Volatile Memory (NVM) and Logic Integration", Office Action—Rejection, Mar. 13, 2013.

U.S. Appl. No. 13/343,331, Shroff, M., et al., "Non-Volatile Memory (NVM) and Logic Integration", Office Action—Allowance, Jun. 24, 2013.

U.S. Appl. No. 13/441,426, Shroff, M., et al., "Non-Volatile Memory (NVM) and Logic Integration", Office Action—Allowance, Sep. 9, 2013.

U.S. Appl. No. 13/780,574, Hall, M.D., et al., Non-Volatile Memory (NVM) and Logic Integration, Office Action—Allowance, Sep. 6, 2013.

U.S. Appl. No. 13/491,760, Shroff, M.., et al., "Integrating Formation of a Replacement Gate Transistor and a Non-Volatile Memory Cell Using an Interlayer Dielectric", Office Action—Allowance, Jul. 1, 2013.

U.S. Appl. No. 13/491,771, Hall, M., et al., "Integrating Formation of a Replacement Gate Transistor and a Non-Volatile Memory Cell Using a High-K Dielectric", filed Jun. 8, 2012.

U.S. Appl. No. 13/790,225, Hall, M., et al., "Integrating Formation of a Replacement Gate Transistor and a non-Volatile Memory Cell Having Thin Film Storage", filed Mar. 8, 2013.

U.S. Appl. No. 13/790,014, Hall, M., et al., "Integrating Formation of a Logic Transistor and a None-Volatile Memory Cell Using a Partial Replacement Gate Technique", filed Mar. 8, 2013.

U.S. Appl. No. 13/955,665, Perera, A.H., "Non-Volatile Memory (NVM) and High K and Metal Gate Integration Using Gate First Methodology", filed Jul. 31, 2013.

U.S. Appl. No. 14/041,591, Perera, A.H., "Non-Volatile Memory (NVM) and High K and Metal Gate Integration Using Gate Last Methodology", filed Sep. 30, 2013.

U.S. Appl. No. 13/971,987, Perera, A.H., et al., "Integrated Split Gate Non-Volatile Memory Cell and Logic Structure", filed Aug. 21, 2013.

U.S. Appl. No. 13/972,372, Perera, A.H., et al., "Integrated Split Gate Non-Volatile Memory Cell and Logic Device", filed Aug. 21, 2013.

U.S. Appl. No. 14/041,662, Perera, A. H., et al., "Non-Volatile Memory (NVM) and High-K and Metal Gate Integration Using Gate-Last Methodology", filed Sep. 30, 2013.

U.S. Appl. No. 13/962,338, Perera, A.H., "Nonvolatile Memory Bitcell With Inlaid High K Metal Select Gate", filed Aug. 8, 2013.

U.S. Appl. No. 13/973,433, Perera, A.H., et al., "Method to Form a Polysilicon Nanocrystal Thin Film Storage Bitcell Within a High K Metal Gate Platform Technology Using a Gate Last Process to Form Transistor Gates", filed Aug. 22, 2013.

U.S. Appl. No. 13/928,666, Hong, C. M., et al., "Non-Volatile Memory (NVM) and High Voltage Transistor Integration", filed Jun. 27, 2013.

U.S. Appl. No. 14/023,440, Baker, F.K., Jr., et al., "Non-Volatile Memory (NVM) Cell and High-K and Metal Gate Transistor Integration", filed Sep. 10, 2013.

U.S. Appl. No. 13/969,180, Perera, A.H., et al., "Non-Volatile Memory (NVM) Cell, High Voltage Transistor, and High-K and Metal Gate Transistor Integration", filed Aug. 16, 2013.

(56) References Cited

OTHER PUBLICATIONS

U.S. Appl. No. 13/973,549, Hong, C.M., et al., "Split-Gate non-Volatile Memory (NVM) Cell and Device Structure Integration", filed Aug. 22, 2013.
U.S. Appl. No. 13/780,591, Hall, M.D., et al., "Non-Volatile Memory (NVM) and Logic Integration", filed Feb. 28, 2013.
U.S. Appl. No. 13/491,760, Shroff, M.D., et al., "Integrating Formation of a Replacement Gate Transistor and a Non-Volatile Memory Cell Using an Interlayer Dielectric", filed Jun. 8, 2012.
U.S. Appl. No. 13/661,157, Shroff, M.D., et al., "Method of Making a Logic Transistor and a Non-Volatile Memory (NVM) Cell", filed Oct. 26, 2012.
U.S. Appl. No. 13/781,727, Shroff, M., et al., "Methods of Making Logic Transistors and non-Volatile Memory Cells", Office Action—Restriction, Jun. 21, 2013.
Office Action mailed Jan. 16, 2014 in U.S. Appl. No. 13/491,771.
U.S. Appl. No. 13/781,727, Office Action—Allowance, May 12, 2014.
U.S. Appl. No. 13/441,426, Shroff, M. D., et al., Office Action—Allowance, mailed Jun. 9, 2014.
U.S. Appl. No. 13/907,491, Office Action—Rejection, Sep. 3, 2013.
U.S. Appl. No. 13/343,331, Office Action—Allowance, Nov. 8, 2013.
Office Action—Allowance mailed Feb. 21, 2014 in U.S. Appl. No. 13/441,426.
Office Action—Allowance mailed Feb. 28, 2014 in U.S. Appl. No. 13/442,142.
Office Action—Allowance mailed Mar. 3, 2014 in U.S. Appl. No. 13/790,014.
Office Action—Allowance mailed Mar. 6, 2014 in U.S. Appl. No. 13/491,771.
Office Action—Allowance mailed Mar. 11, 2014 in U.S. Appl. No. 13/907,491.
Office Action—Allowance mailed Mar. 12, 2014 for U.S. Appl. No. 13/790,225.
Non-Final Rejection mailed Apr. 30, 2015 for U.S. Appl. No. 14/195,299, 7 pages.
Notice of Allowance mailed Apr. 24, 2015 for U.S. Appl. No. 13/661,157, 8 pages.
Notice of Allowance mailed Apr. 9, 2015 for U.S. Appl. No. 14/228,682, 9 pages.

* cited by examiner

NON-VOLATILE MEMORY (NVM) AND HIGH-K AND METAL GATE INTEGRATION USING GATE-FIRST METHODOLOGY

BACKGROUND

1. Field

This disclosure relates generally to non-volatile memories (NVMs) and logic transistors, and more particularly, integrating NVMs with logic transistors that have high-k gate dielectrics and metal gates using a gate-first methodology.

2. Related Art

The integration of non-volatile memories (NVMs) with logic transistors has always been a challenge due to the different requirements for the NVM transistors, which store charge, and the logic transistors which are commonly intended for high speed operation. The need for storing charge has been addressed mostly with the use of floating gates but also with nanocrystals or nitride. In any of these cases, the need for this unique layer makes integration of the NVM transistors and the logic transistors difficult. The particular type of charge storage layer can also have a large effect on the options that are available in achieving the integration.

Accordingly there is a need to provide an integration that improves upon one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an integration of a non-volatile memory (NVM) cell in a NVM portion of an integrated circuit and a logic transistor in a logic portion of the integrated circuit includes forming the gate structure of the NVM cell in the NVM portion, including the charge storage layer, while masking the logic portion. The logic gate is formed while masking the NVM portion with a hard mask that is subsequently used to form sidewall spacers in the NVM portion. Source/drain implants are performed simultaneously in the NVM and logic portions using the sidewall spacers as masks. This is better understood by reference to the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above. Oxide layer refers to a silicon oxide layer unless otherwise noted. Similarly, nitride layer refers to a silicon nitride layer unless otherwise noted.

Figure 1:
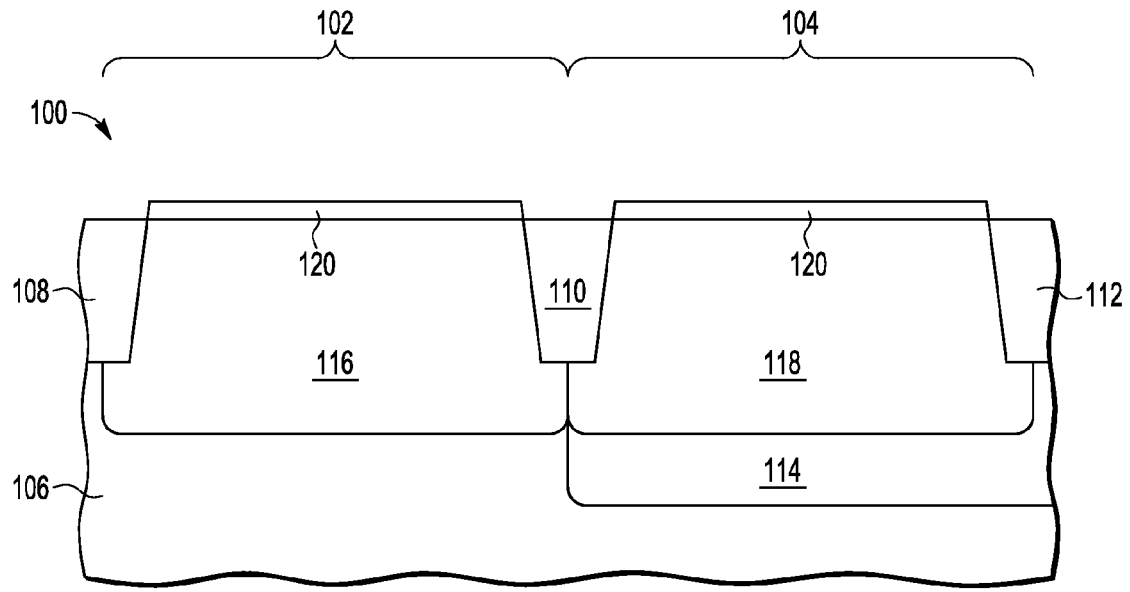
FIG. 1 is a cross section of a semiconductor structure having a non-volatile memory (NVM) structure and a logic transistor structure at a stage in processing according to an embodiment.

Shown in FIG. 1 is a semiconductor structure 100 of an integrated circuit having an NVM portion 102 and a logic portion 104. Semiconductor structure 100 has a substrate 106, an isolation region 110 separating logic portion 104 from NVM portion 102, an isolation region 108 in NVM portion 102 that, along with isolation region 110, defines borders of an active region in NVM portion 102, a P well 116 in substrate 106 in the NVM portion extending from the surface of substrate 106, a P well 118 in logic portion 104 that extends from the surface of substrate 106, an N region 114 below P well 118 for aiding in providing noise isolation for the logic transistors, an oxide layer 120 on the top surface of substrate 106 in NVM portion 102 and logic portion 104. Oxide layer 120 can be a thermal oxide that is grown, rather than deposited, for high quality electrical insulation. Isolation region 112 in logic portion 104, along with isolation region 110, defines borders of an active region in logic portion 104.

Figure 2:
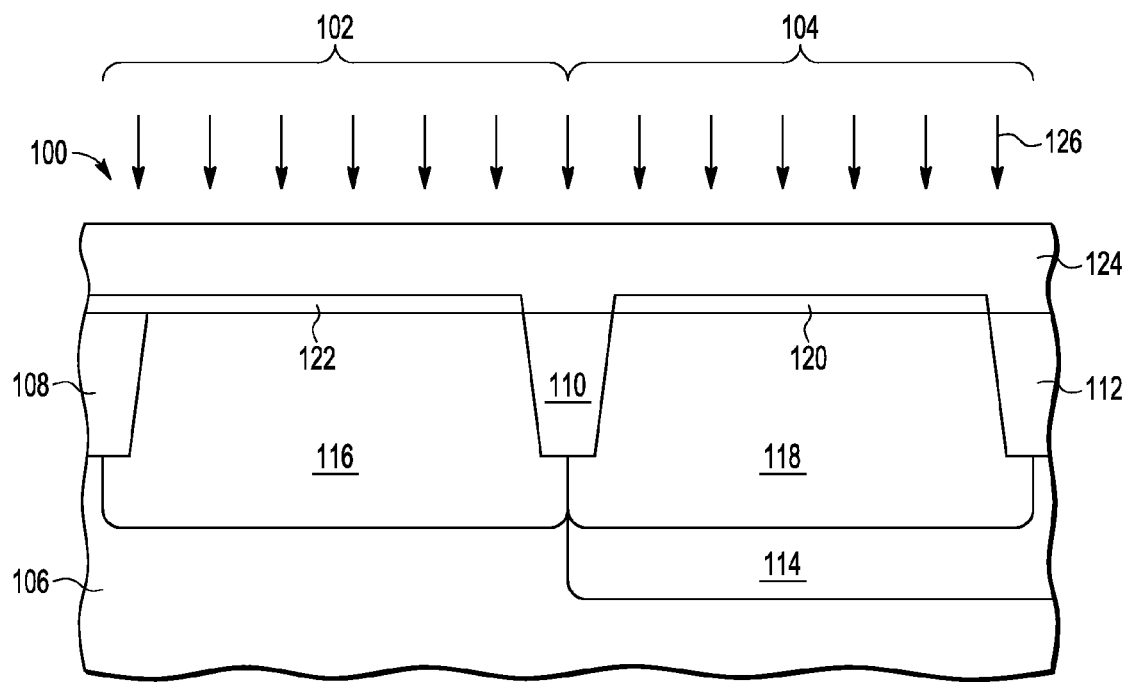
FIG. 2 is a cross section of the semiconductor structure of FIG. 1 at a subsequent stage in processing.

Shown in FIG. 2 is semiconductor structure 100 after oxide layer 120 is removed from NVM portion 102, an oxide layer 122 of thickness different than oxide layer 120 is either grown or deposited in NVM portion 102, and polysilicon layer 124 is deposited over oxide layers 120, 122 and isolation regions 108-112. Polysilicon layer 124 may be doped in situ or by implant 126 with an N-type material for forming N-channel transistors. N wells can also be formed in other portions of logic portion 104, which are not shown, for the forming P channel transistors.

Figure 3:
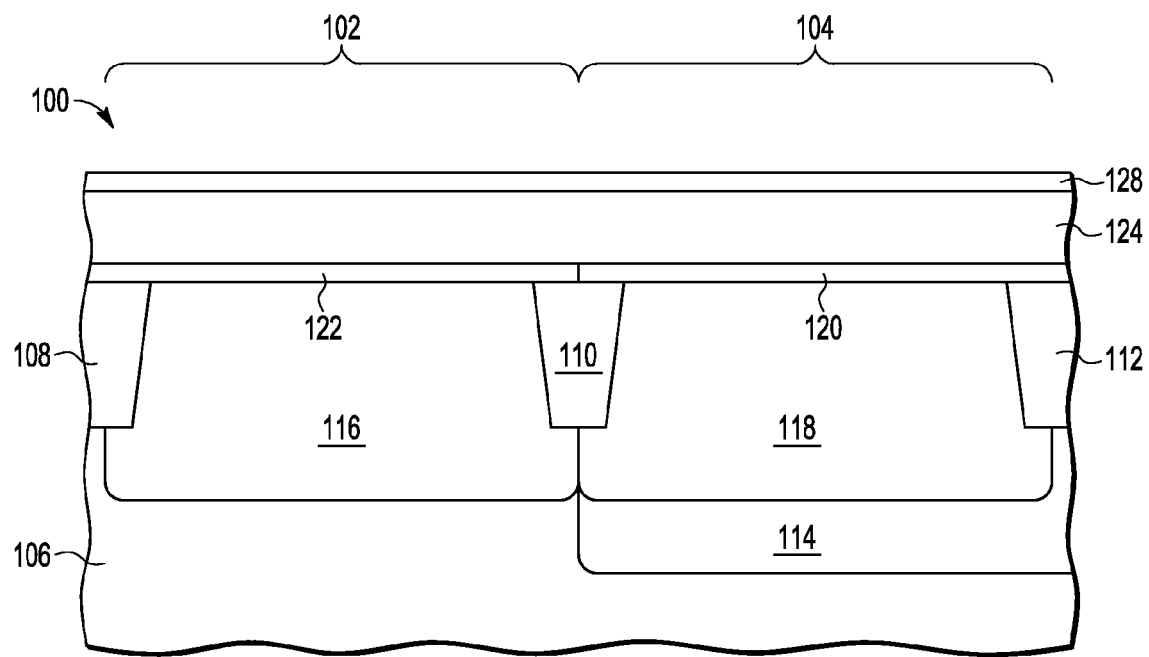
FIG. 3 is a cross section of the semiconductor structure of FIG. 2 at a subsequent stage in processing.

Shown in FIG. 3 is semiconductor structure 100 after nitride layer 128 (also referred to as an optical patterning layer) is deposited on polysilicon layer 124 in NVM portion 102 and logic portion 104. Alternatively, a layer of oxide (not shown) may be deposited over polysilicon layer 124 instead of nitride layer 128.

Figure 4:
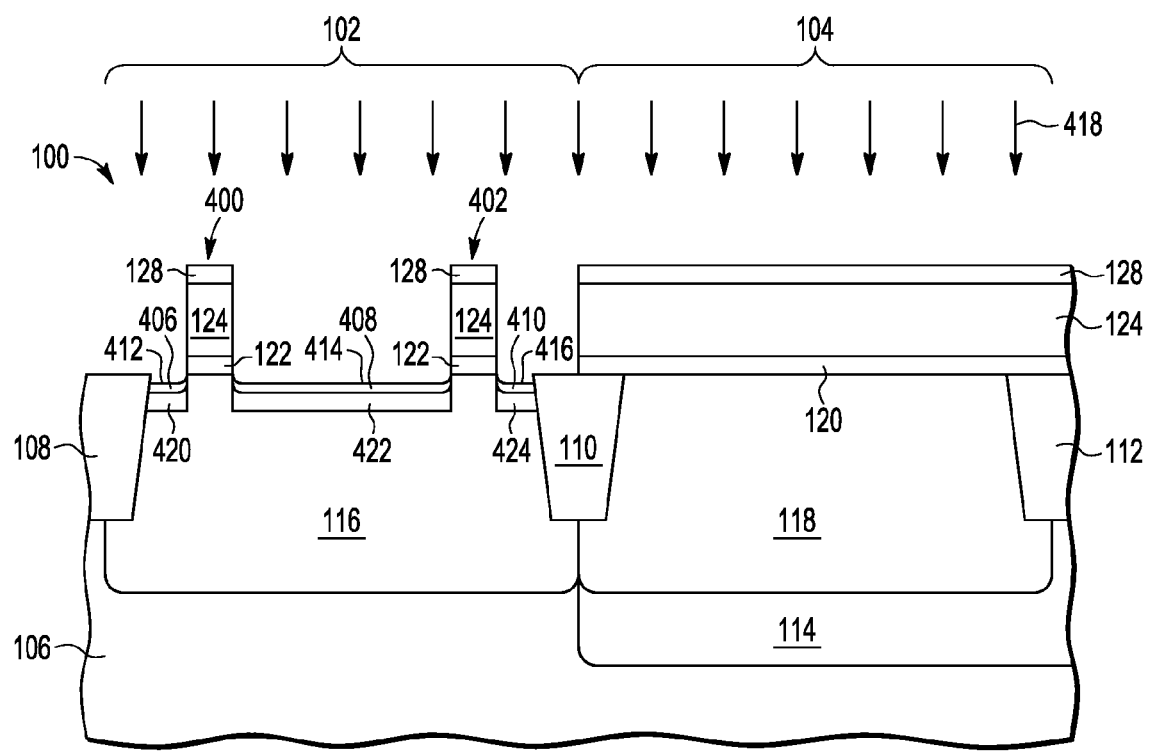
FIG. 4 is a cross section of the semiconductor structure of FIG. 3 at a subsequent stage in processing.

Shown in FIG. 4 is semiconductor structure 100 after polysilicon layer 124 and oxide layer 122 in NVM portion 102 are patterned to form select gate structures 400, 402. Patterning is typically performed using patterned photoresist and etching unmasked portions of the photoresist. Trenches 406, 408, 410 can be formed adjacent select gate structures 400, 402 and in logic portion 104 by removing portions of P well 116 in NVM portion 102 during the etch. A layer of repair oxide 412, 414, 416 may be grown in trenches 406, 408, 410 before P well 116 is counterdoped in the area below trenches 406, 408, 410 with N-type material 418. Polysilicon layer 124 and nitride layer 128 remain in logic portion 104.

Figure 5:
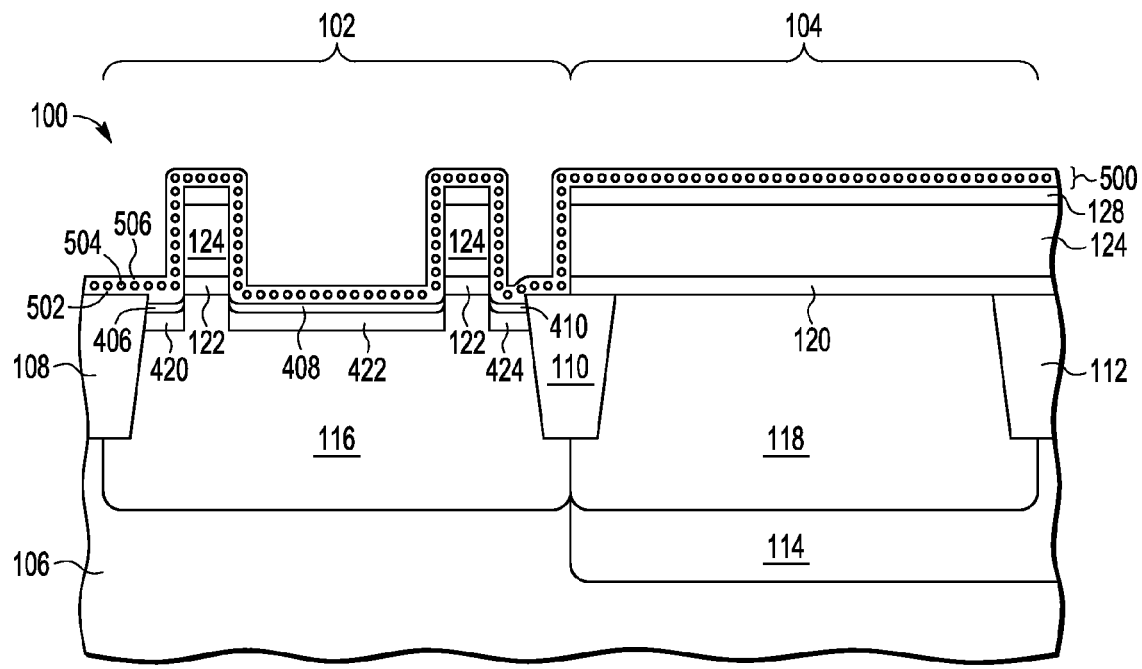
FIG. 5 is a cross section of the semiconductor structure of FIG. 4 at a subsequent stage in processing.

Shown in FIG. 5 is semiconductor structure 100 after charge storage layer 500 is formed in NVM portion 102 and logic portion 104. Charge storage layer 500 can be formed by first growing a thermal oxide layer 502 on the exposed top surface of substrate 106 and on the exposed surfaces of select gate structures 400, 402 (FIG. 4) in NVM region 102 as well as over nitride layer 128 in logic portion 104. This oxide layer 502 may be thinner over the nitride. Oxide layer 502 grown on the top surface of substrate 106 is of particular importance because that is where charge will pass during program and erase. Nanocrystals 504 are formed on the grown oxide layer 502 and a top oxide layer 506 is deposited on and around the nanocrystals 504.

Figure 6:
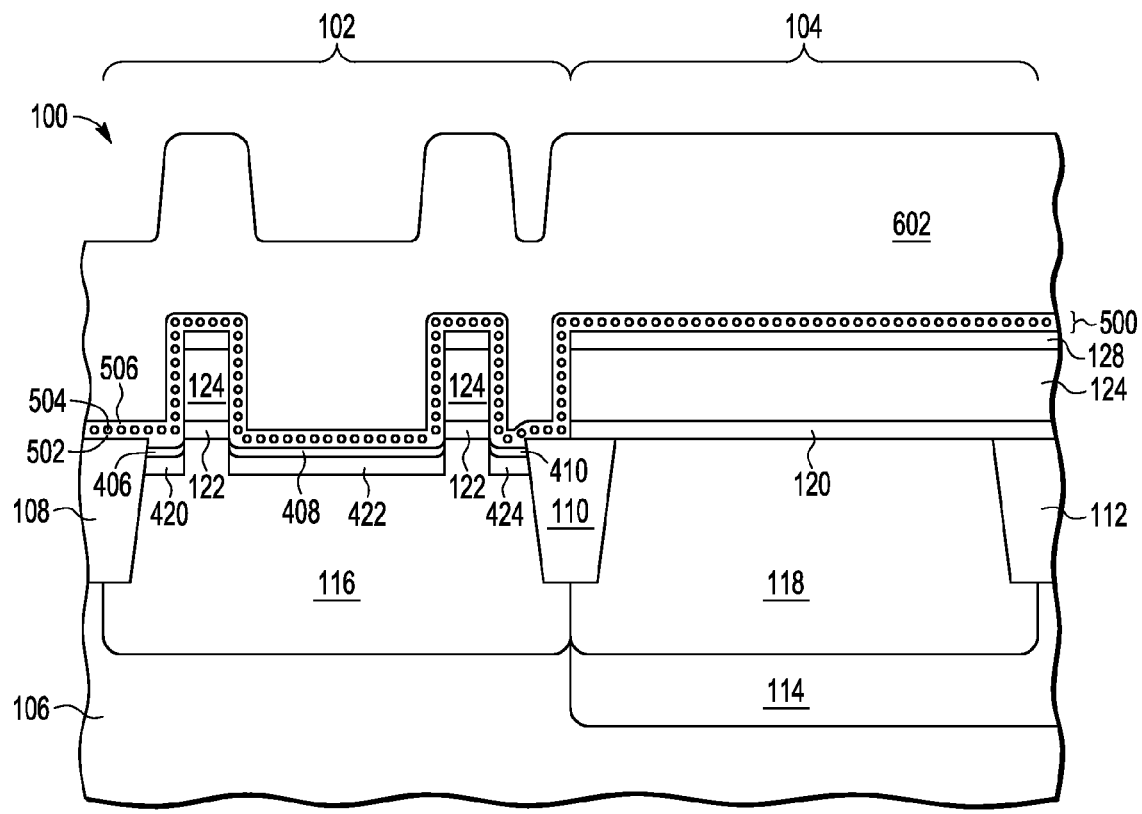
FIG. 6 is a cross section of the semiconductor structure of FIG. 5 at a subsequent stage in processing.

Shown in FIG. 6 is semiconductor structure 100 after depositing a polysilicon layer 602 on charge storage layer 500.

Figure 7:
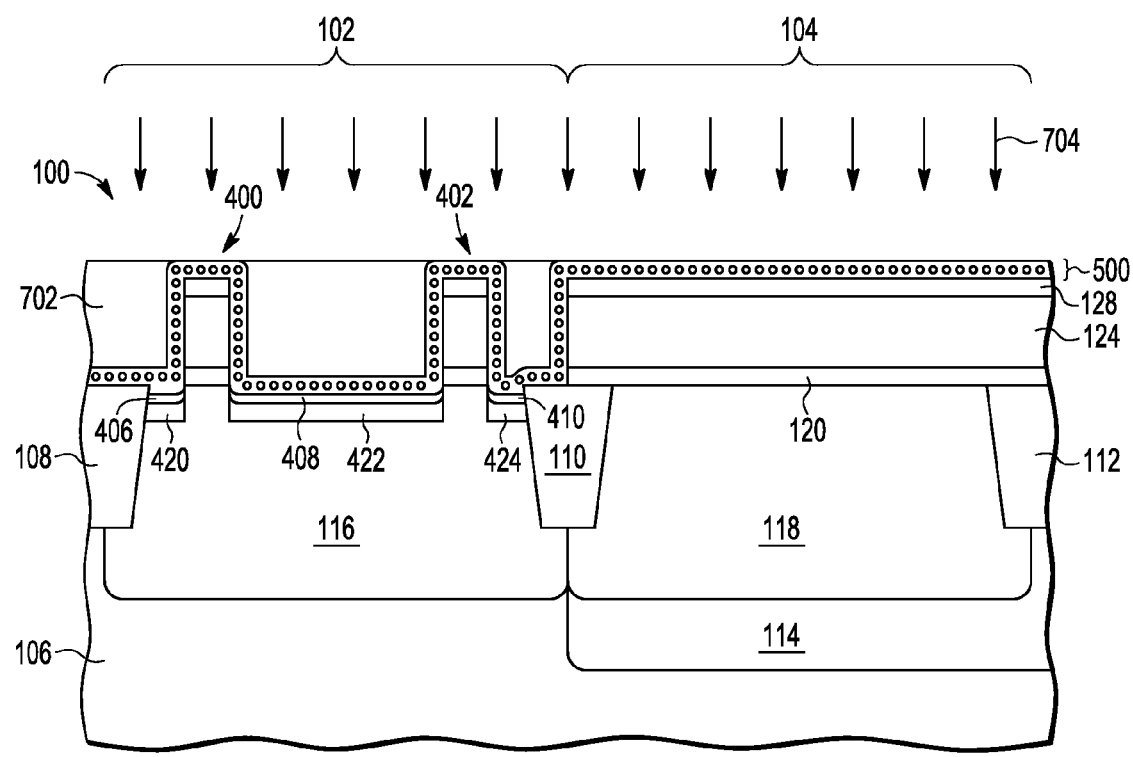
FIG. 7 is a cross section of a semiconductor structure of FIG. 6 at a subsequent stage in processing.

Shown in FIG. 7 is semiconductor structure 100 after polysilicon layer 602 is polished down to charge storage layer 500 using a chemical-mechanical polishing (CMP) process. After the CMP, control gate polysilicon regions 702 remain adjacent select gate structures 400, 402 and portions of charge storage layer 500. As also shown in FIG. 7, control gate polysilicon regions 702 can be made conductive by in situ or implant doping with N-type material 704.

Figure 8:
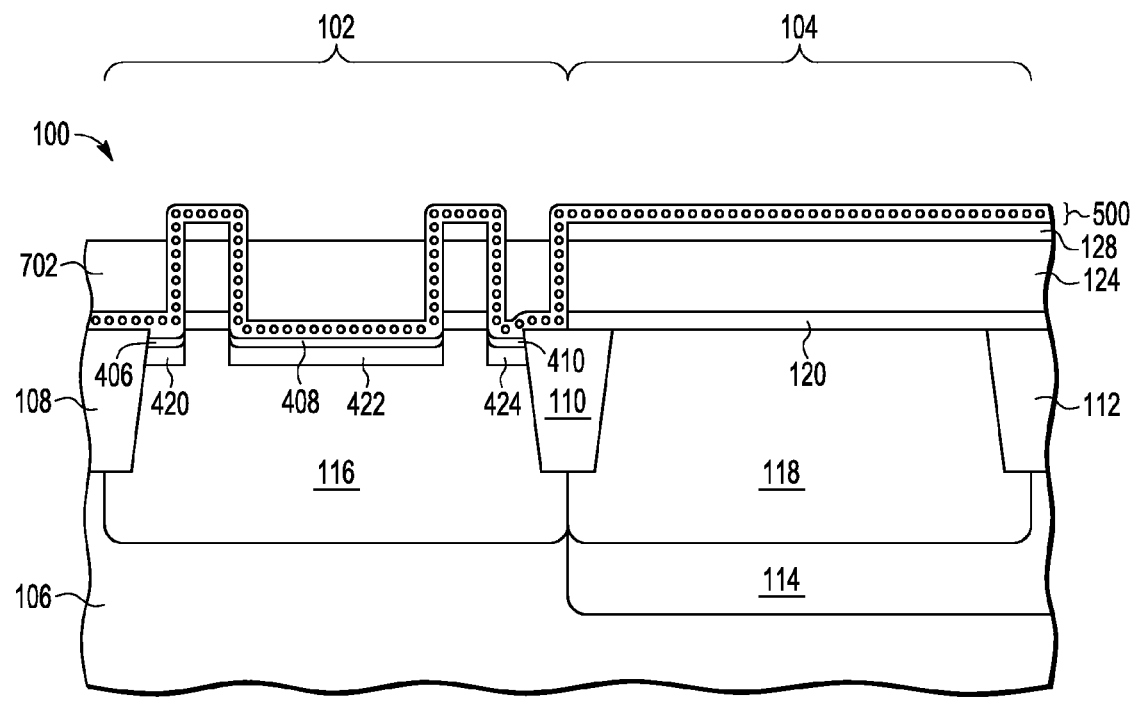
FIG. 8 is a cross section of the semiconductor structure of FIG. 7 at a subsequent stage in processing.

Shown in FIG. 8 is semiconductor structure 100 after control gate polysilicon regions 702 are recessed using an etch process. The height of control gate polysilicon regions 702 after recess etching is approximately level with the height of polysilicon layers 124 (FIG. 4) of select gate structures 400, 402 (FIG. 4).

Figure 9:
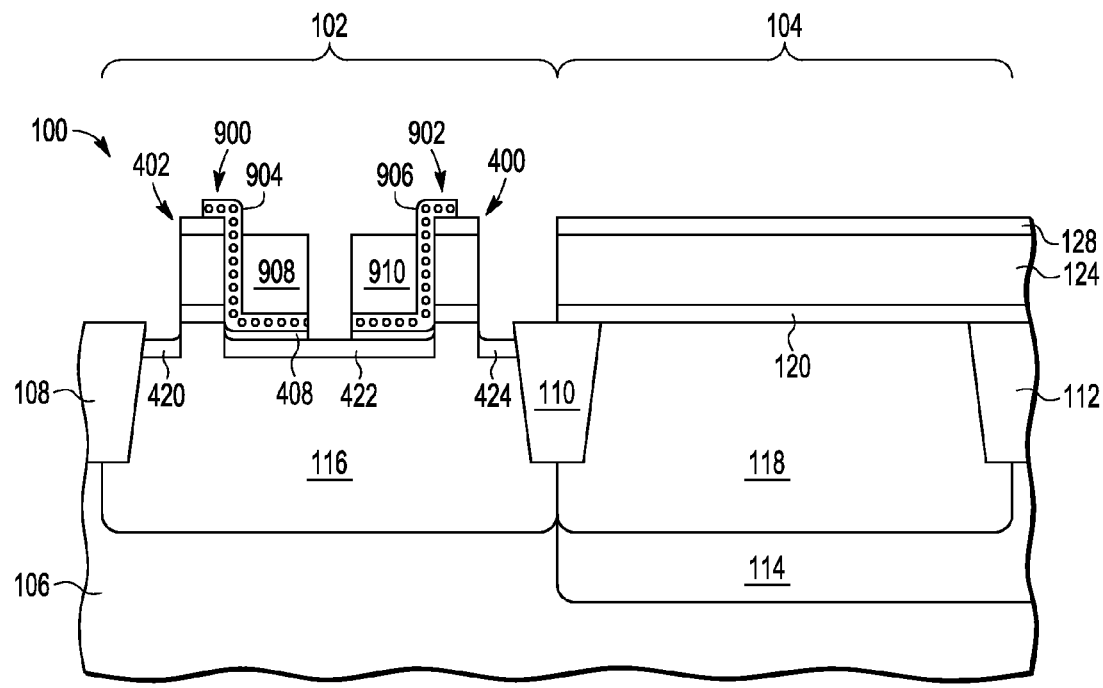
FIG. 9 is a cross section of the semiconductor structure of FIG. 8 at a subsequent stage in processing.

Shown in FIG. 9 is semiconductor structure 100 after charge storage layer 500 (FIG. 5) and control gate polysilicon regions 702 are patterned and etched resulting in NVM control gate structures 908 and 910 partially overlapping respective select gate structures 400, 402 in NVM region 102. Remaining sections of charge storage layer 904, 906 partially overlap respective select gate structures 400, 402 and are between select gate structures 400, 402 and control gate structures 908, 910. Charge storage layer 500 is removed from logic portion 104.

Figure 10:
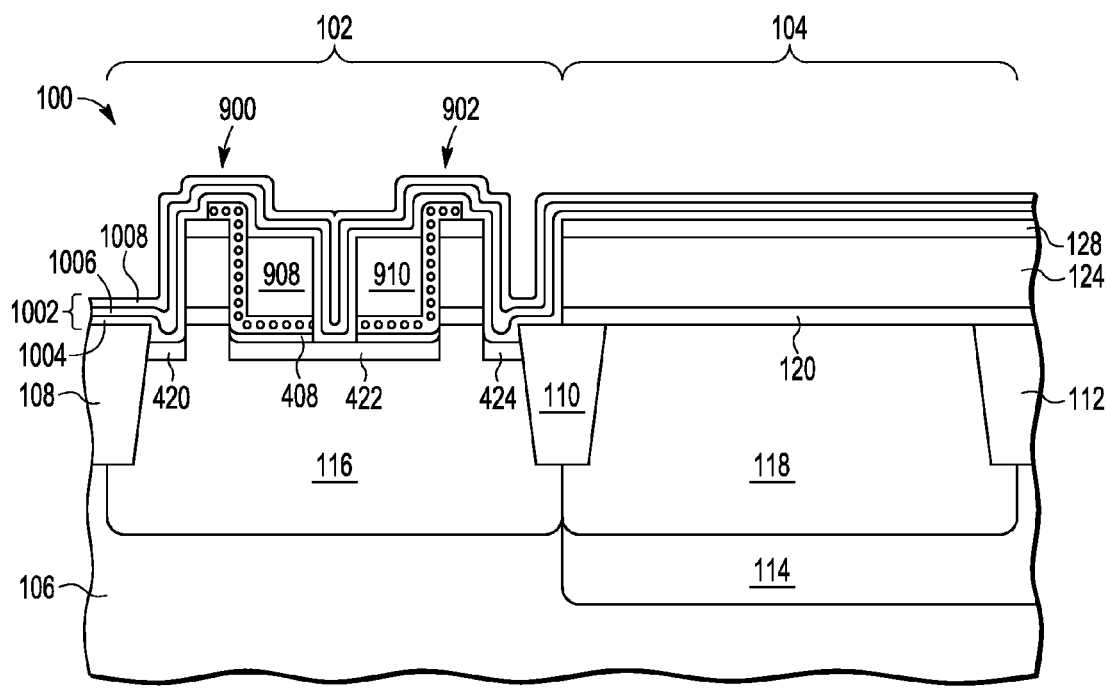
FIG. 10 is a cross section of the semiconductor structure of FIG. 9 at a subsequent stage in processing.

Shown in FIG. 10 is semiconductor structure 100 after depositing a protective layers 1002 including an oxide layer 1004, a nitride layer 1006 on oxide layer 1004, and an oxide layer 1008 on nitride layer 1006.

Figure 11:
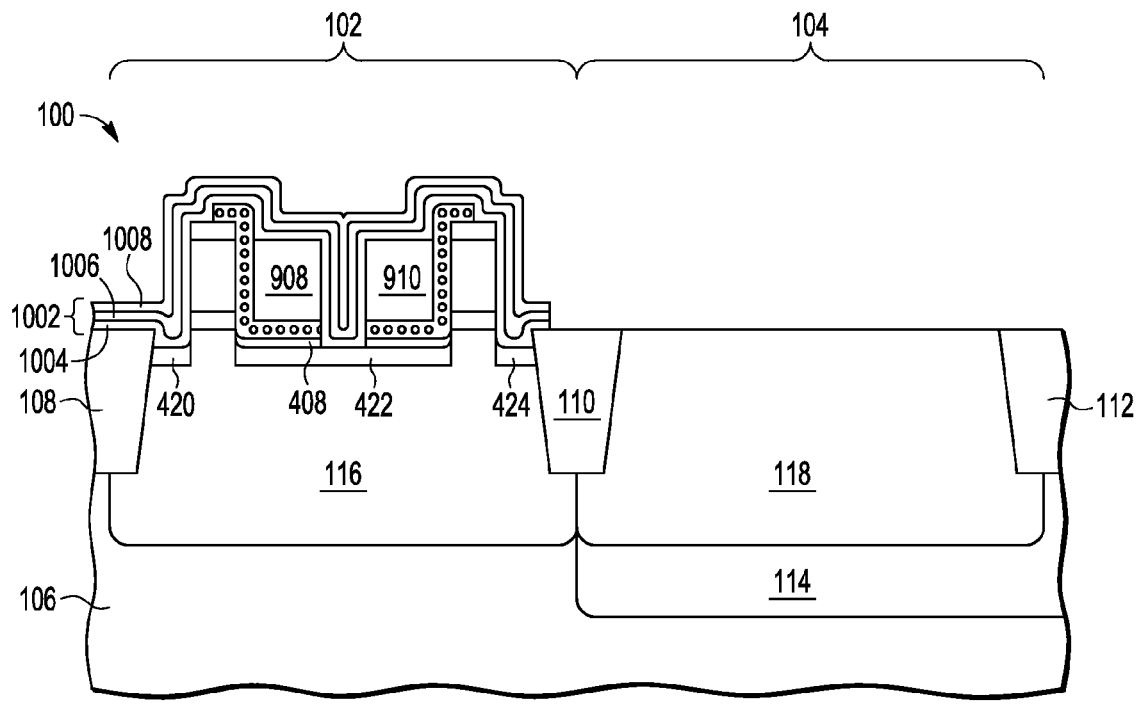
FIG. 11 is a cross section of the semiconductor structure of FIG. 10 at a subsequent stage in processing.

Shown in FIG. 11 is semiconductor structure 100 after removing protective layers 1002, capping layer 128, polysilicon layer 124 and oxide layer 120 from logic portion 104. The remaining portion of protective layers 1002 over NVM portion 102 functions as a hard mask for the components in NVM portion 102.

Figure 12:
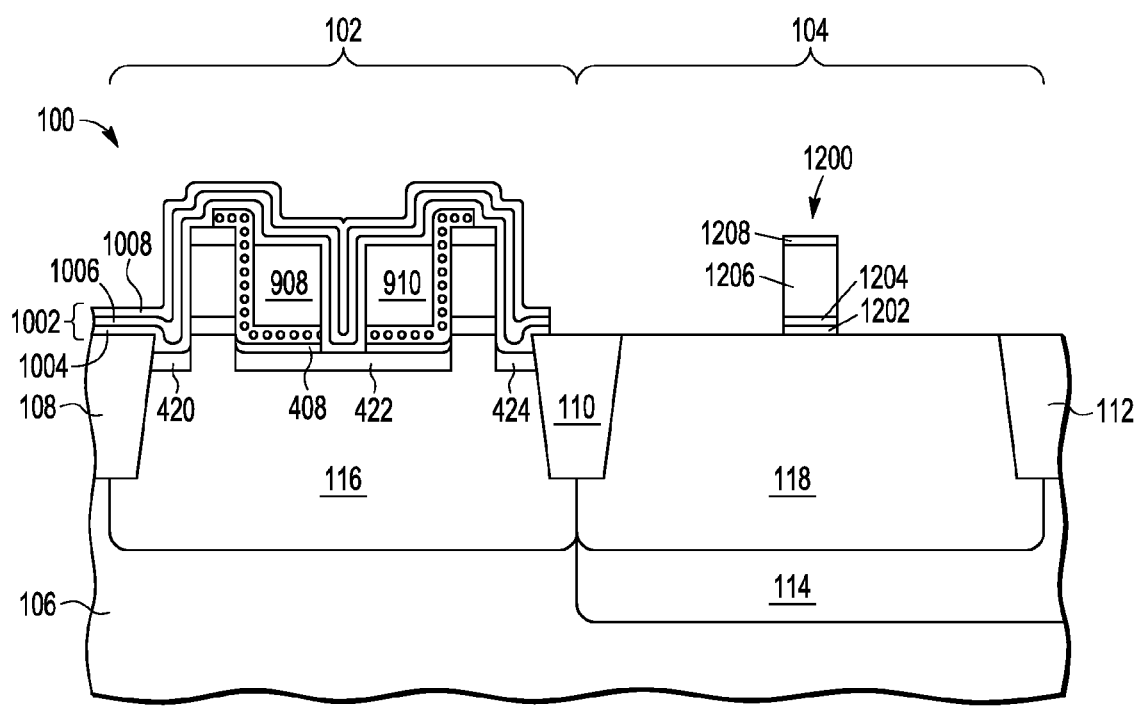
FIG. 12 is a cross section of the semiconductor structure of FIG. 11 at a subsequent stage in processing.

Shown in FIG. 12 is semiconductor structure 100 after forming a patterned logic gate structure 1200 in logic portion 104 that includes a layer of grown oxide 1202 over P well 118, a layer of high-k dielectric 1204 over oxide 1202, a layer of work function metal (not shown) over high-k dielectric 1204, a layer of barrier metal (not shown) over the work function metal, a layer of polysilicon 1206 over barrier metal, and an oxide layer 1208 over polysilicon 1206. Combinations of work function metal and the barrier metal sets the work function of N and P channel transistors and provides a highly conductive gate conductor for both N and P transistor types in logic portion 104. The etch of the barrier metal and work function metals can have the effect of metal making contact with NVM portion 102, which can contaminate charge storage layer sections 904, 906 (FIG. 9), especially since charge storage layer sections 904, 906 have nanocrystals. The hard mask formed by protective layer 1002 prevents the nanocrystals from becoming contaminated. The oxide layer 1008 in the NVM portion 102 is removed during pre-clean performed prior to growing oxide layer 1202.

Figure 13:
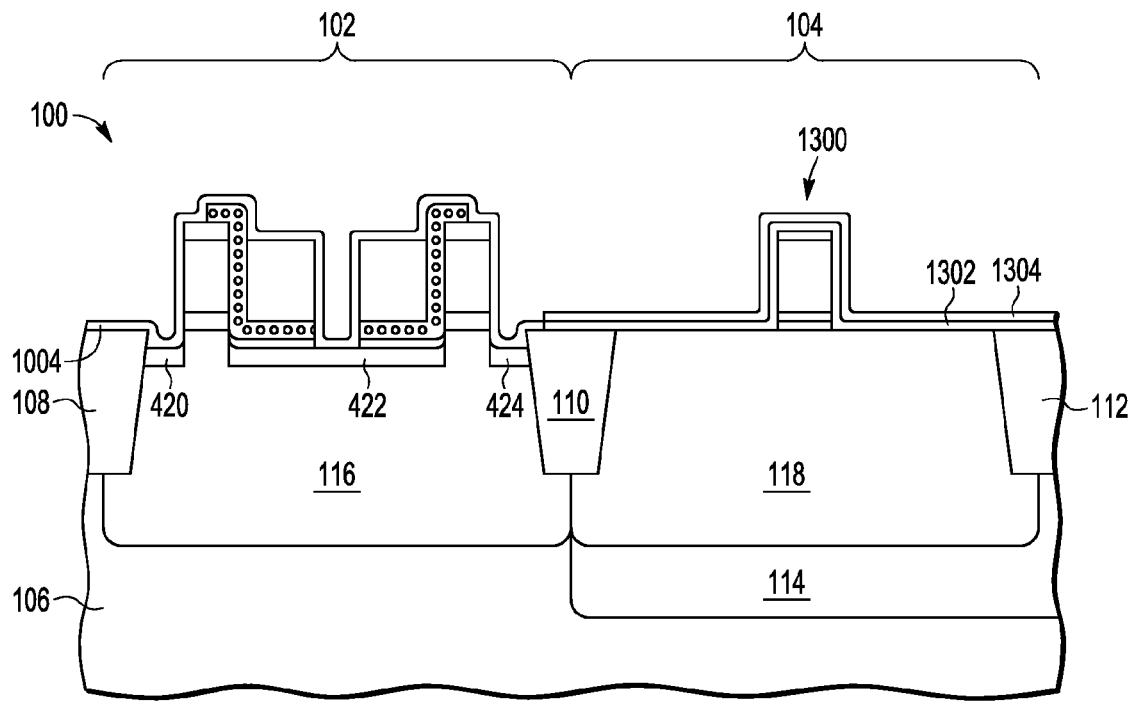
FIG. 13 is a cross section of the semiconductor structure of FIG. 12 at a subsequent stage in processing.

Shown in FIG. 13 is semiconductor structure 100 after depositing a nitride layer 1302 and an oxide layer 1304 on the substrate 106 over both the NVM portion 102 and logic portion 104 and subsequent processing as further described herein. Oxide layer 1304 is on nitride layer 1302. Oxide layer 1304 and nitride layer 1302 are conformal. The oxide layer 1302 is selectively removed from the NVM portion 102 using a photo resist mask (not shown) to protect the logic portion 104, leaving the NVM portion 102 covered by oxide layer 1004, nitride layer 1006 and nitride layer 1304 and the logic portion 104 covered by nitride layer 1302 and oxide layer 1304. An isotropic etch, such as a hot phosphoric acid wet etch, which etches nitride selective to oxide, can be used to remove nitride layers 1302 and 1006 from the NVM portion 102 while the nitride layer 1302 remains on the logic portion 104 since the nitride layer 1302 is protected by oxide layer 1302 as shown in FIG. 13.

Figure 14:
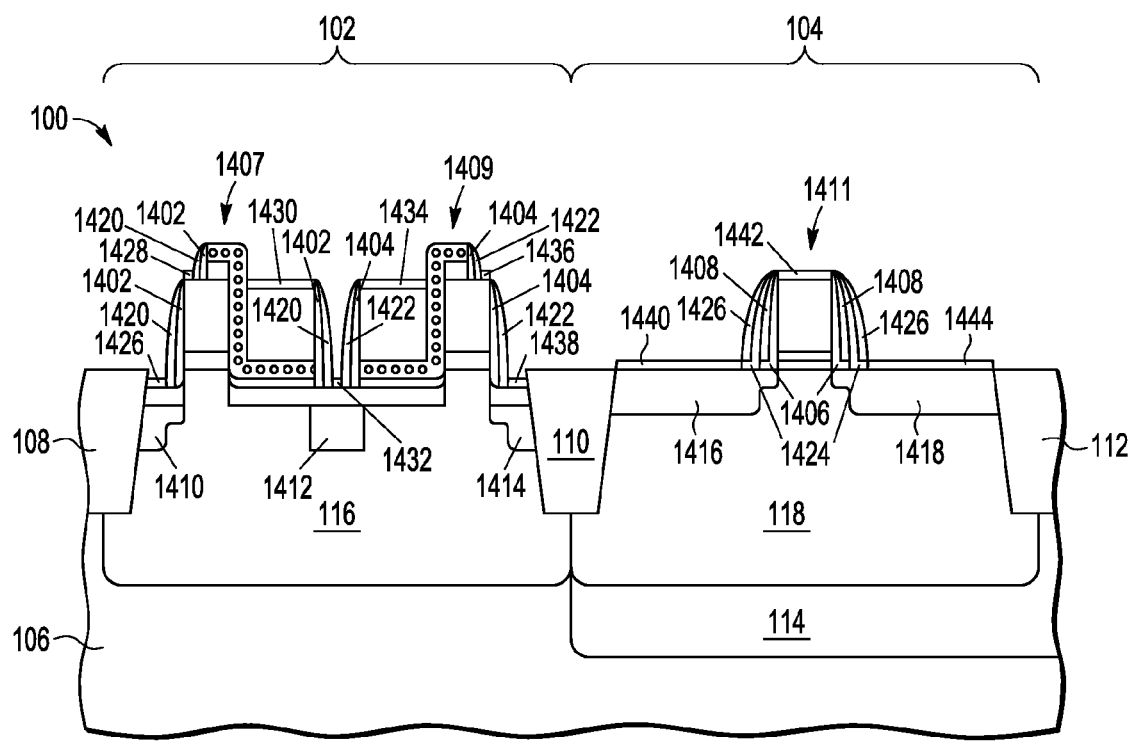
FIG. 14 is a cross section of the semiconductor structure of FIG. 13 at a subsequent stage in processing.

Shown in FIG. 14 is semiconductor structure 100 after performing an anisotropic etch of oxide layer 1304 and a subsequent etch of nitride layer 1302 that results in oxide layer 1004 becoming sidewall spacers 1402, 1404 around respective split gate NVM cells 1407, 1409 in NVM portion 102. Sidewall spacer 1402 is adjacent to the select gate and an upper portion of the control gate structure on one side and a lower portion of the control gate on the other side. Sidewall spacer 1404 surrounds an upper portion of the control gate on one side of NVM gate structure 1409 and is adjacent to a lower portion of the control gate on one side and the select gate on the other side. After the nitride and oxide etches, nitride layer 1302 becomes sidewall spacer or liner 1406 around logic structure 1411 and oxide layer 1304 becomes sidewall spacer 1408 around liner 1406.

After forming first set of spacers 1402, 1404, 1406, 1408, extension implants may be utilized to dope the substrate 106 with implant material using spacers 1402, 1404, 1406, 1408 as masks. A second nitride spacer 1424 may be formed around logic structure 1411, and oxide spacers 1420, 1422, 1426 may be formed around spacers 1402, 1404, 1406, 1408 of respective NVM cells 1407, 1409 and logic structure 1411. Source/drain implants 1410, 1412, 1414, 1416, 1418 may be formed for respective NVM cells 1407, 1409 and logic structure 1411 using spacers 1420, 1422, 1426, 1424 as masks. Source/drain regions 1410, 1412, 1414, 1416, 1418 are nearly aligned to opposing sides of respective NVM cells 1407, 1409 and logic structure 1411. The source/drain regions shown are N type. The exposed portions of source/drain implants 1410, 1412, 1414, 1416, 1418 and exposed polysilicon of select gates and control gates of respective NVM cells 1407, 1409 and logic structure 1411 can then be silicided to make respective low resistance contacts 1426, 1428, 1430, 1434, 1436, 1438, 1440, 1442, 1444.

Figure 15:
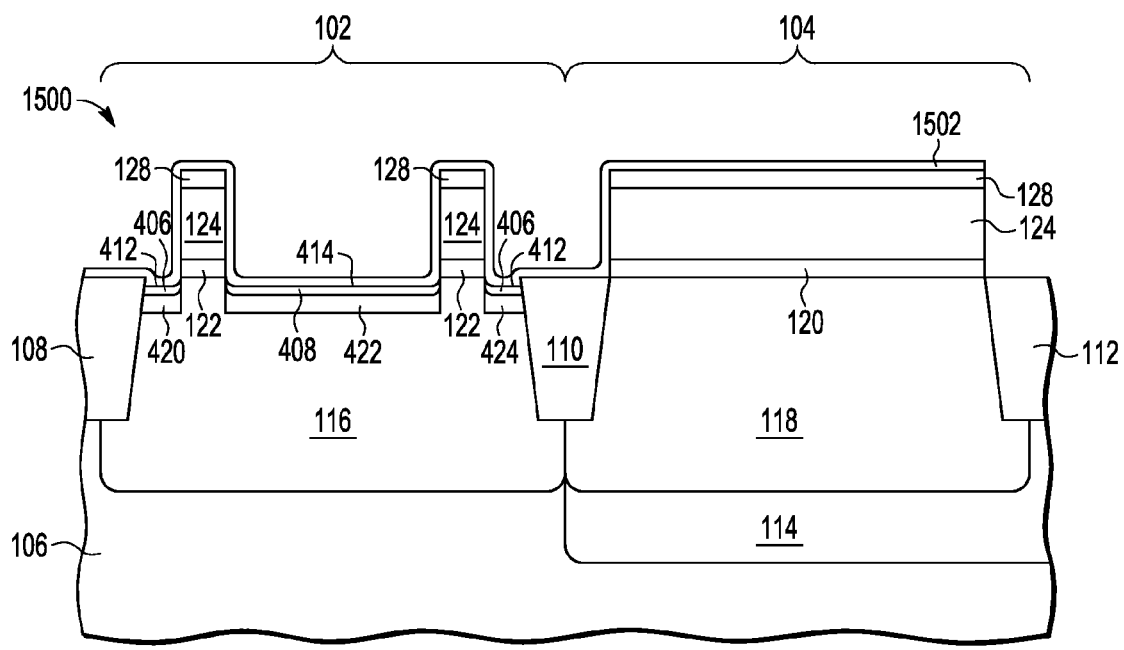
FIG. 15 is a cross section of another embodiment of a semiconductor structure having a non-volatile memory (NVM) structure and a logic transistor structure at an intermediate stage in processing according to another embodiment.

Thus it is shown that metal gate transistors can be made in the presence of NVM cells, even if the NVM cells use nanocrystals, and further that the hard mask used during the metal etch can also subsequently be used in forming sidewall spacers used as an implant mask. Other processing techniques can be used to fabricate semiconductor structure 100 instead of some of the techniques described for the embodiment of semiconductor structure 100 shown in FIGS. 1-14. As an example, FIG. 15 is a cross section of another embodiment of a semiconductor structure 1500 having non-volatile memory (NVM) portion 102 and logic portion 104 at an intermediate stage in processing subsequent to the processing stage shown in FIG. 4 in which a layer of nitride 1502 is conformally deposited over NVM portion 102 and logic portion 104. Nitride layer 1502 can function as an etch stop layer during subsequent processing.

Figure 16:
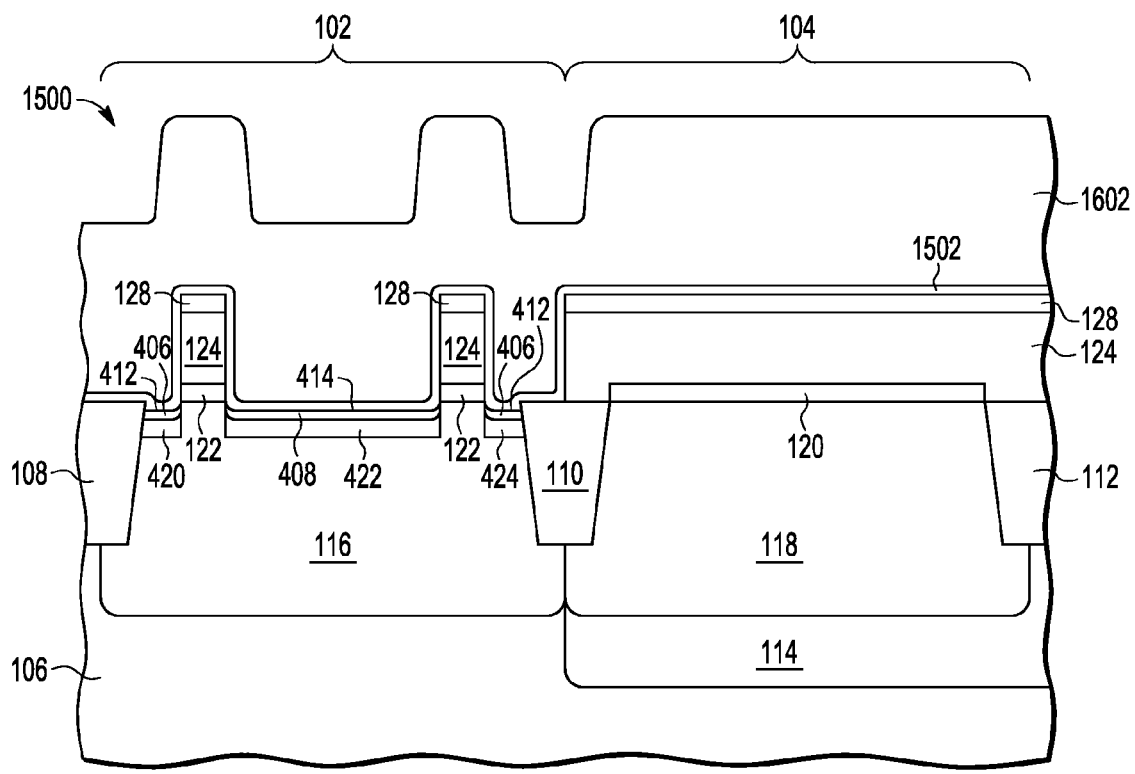
FIG. 16 is a cross section of the semiconductor structure of FIG. 15 at a subsequent stage in processing.

FIG. 16 is a cross section of the semiconductor structure 1500 of FIG. 15 at a subsequent stage in processing after a layer of oxide 1602 is conformally deposited over NVM portion 102 and logic portion 104.

Figure 17:
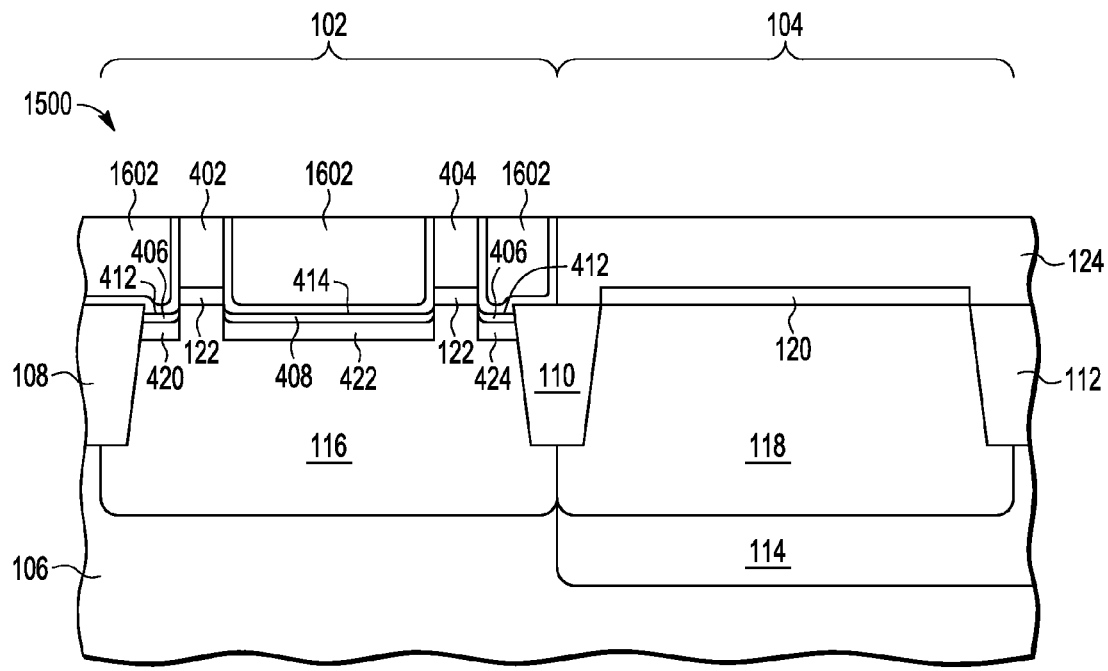
FIG. 17 is a cross section of the semiconductor structure of FIG. 16 at a subsequent stage in processing.

FIG. 17 is a cross section of the semiconductor structure 1500 of FIG. 16 at a subsequent stage in processing after oxide layer 1602 is reduced using a chemical mechanical polishing (CMP) process. Portions of nitride layer 1502 and nitride layer 128 are also removed from the top of select gate structures 402, 404 in NVM portion 102 and from the top of polysilicon layer 124 in logic portion 104. Portions of oxide layer 1602 remain between isolation region 108 and select gate structure 402, and between select gate structures 402 and 404 in NVM region 102, and between select gate structure 404 in NVM region and polysilicon layer 124 in logic region 104.

Figure 18:
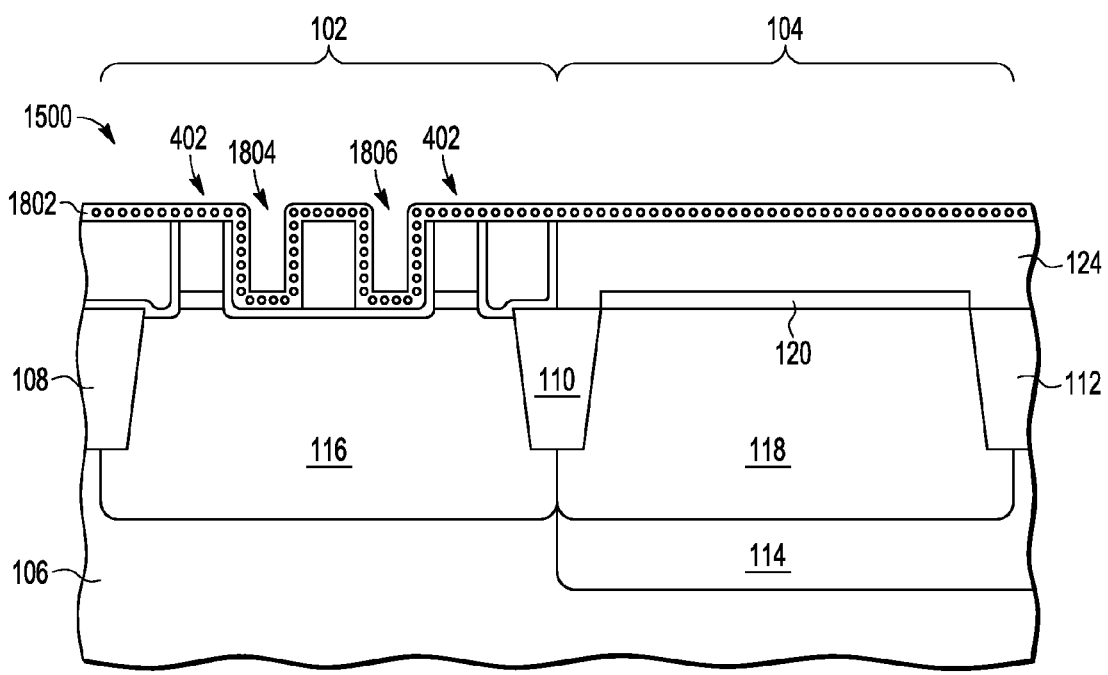
FIG. 18 is a cross section of the semiconductor structure of FIG. 17 at a subsequent stage in processing.

FIG. 18 is a cross section of the semiconductor structure 1500 of FIG. 17 at a subsequent stage in processing after control gate trenches 1804, 1806 are patterned and etched adjacent select gate structures 402, 404, the remaining portions of nitride layer 1502 are removed in NVM portion 102, and charge storage layer 1802 is formed in NVM portion 102 and logic portion 104. Charge storage layer 1802 can be formed with nanocrystals between bottom and top oxide layers, similar to charge storage layer 500 of FIG. 5 and is typically conformal over the structures already present in NVM portion 102 and logic portion 104.

Figure 19:
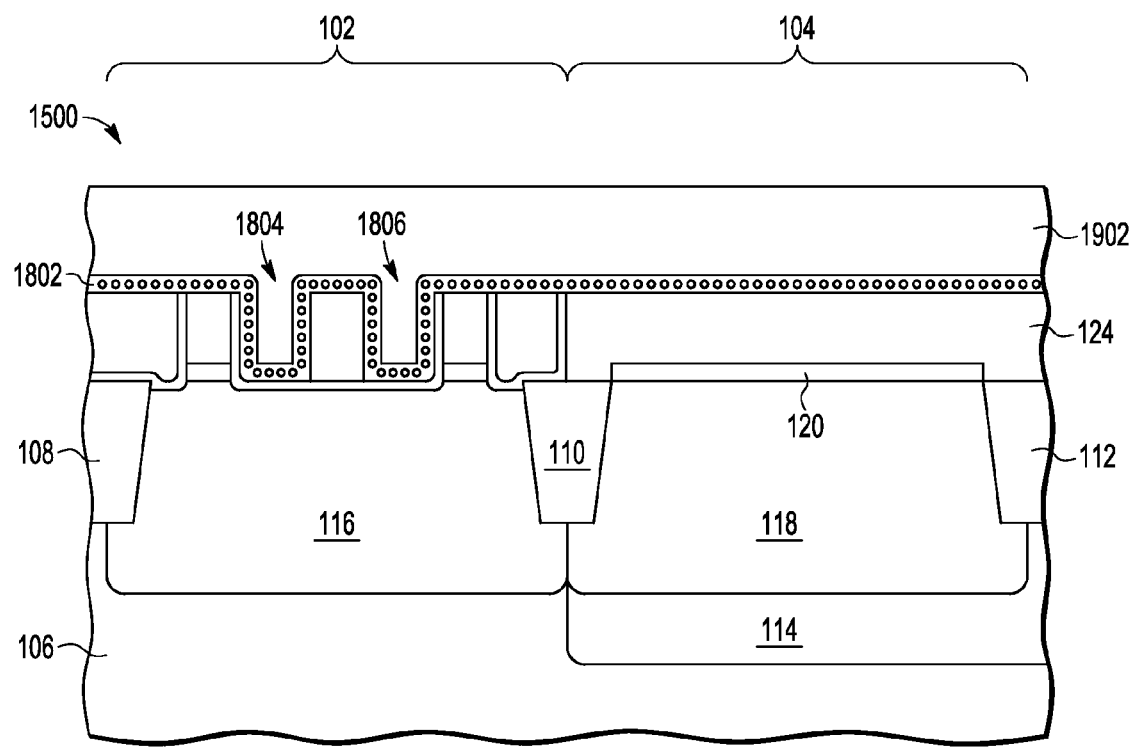
FIG. 19 is a cross section of the semiconductor structure of FIG. 18 at a subsequent stage in processing.

FIG. 19 is a cross section of the semiconductor structure 1500 of FIG. 18 at a subsequent stage in processing after a layer of polysilicon 1902 is deposited over NVM portion 102 and logic portion 104. Polysilicon layer 1902 fills trenches 1804, 1806 and extends above NVM portion 102 and logic portion 104.

Figure 20:
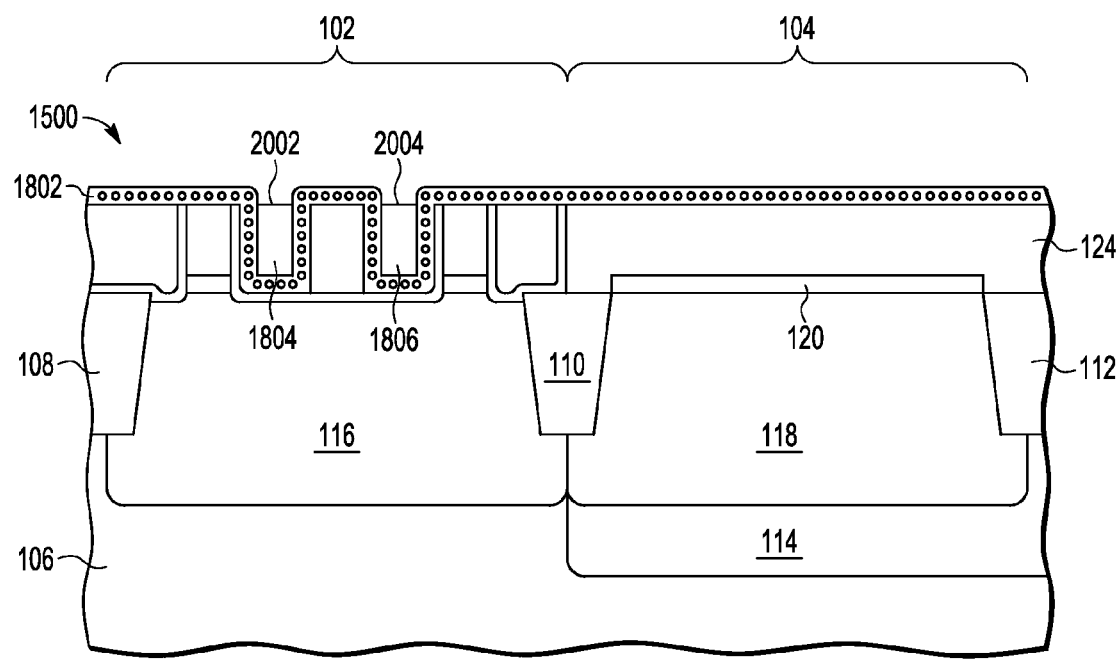
FIG. 20 is a cross section of the semiconductor structure of FIG. 19 at a subsequent stage in processing.

FIG. 20 is a cross section of the semiconductor structure 1500 of FIG. 19 at a subsequent stage in processing after a top portion of polysilicon layer 1902 is removed using a CMP process until polysilicon layer 1902 is removed to the top of charge storage layer 1802. The remaining polysilicon portions 2002, 2004 in trenches 1804, 1806 will be used as control gates for split gate NVM memory cells, as further described herein. Polysilicon portions 2002, 2004 are then recessed by reactive ion etching or other suitable technique. The height of polysilicon portions 2002, 2004 can be approximately the same height as the polysilicon layer 124 (FIG. 4) of select gates 400, 402 (FIG. 4) or other suitable height. Polysilicon portions 2002, 2004 can then be pre-doped with N+ type material.

Figure 21:
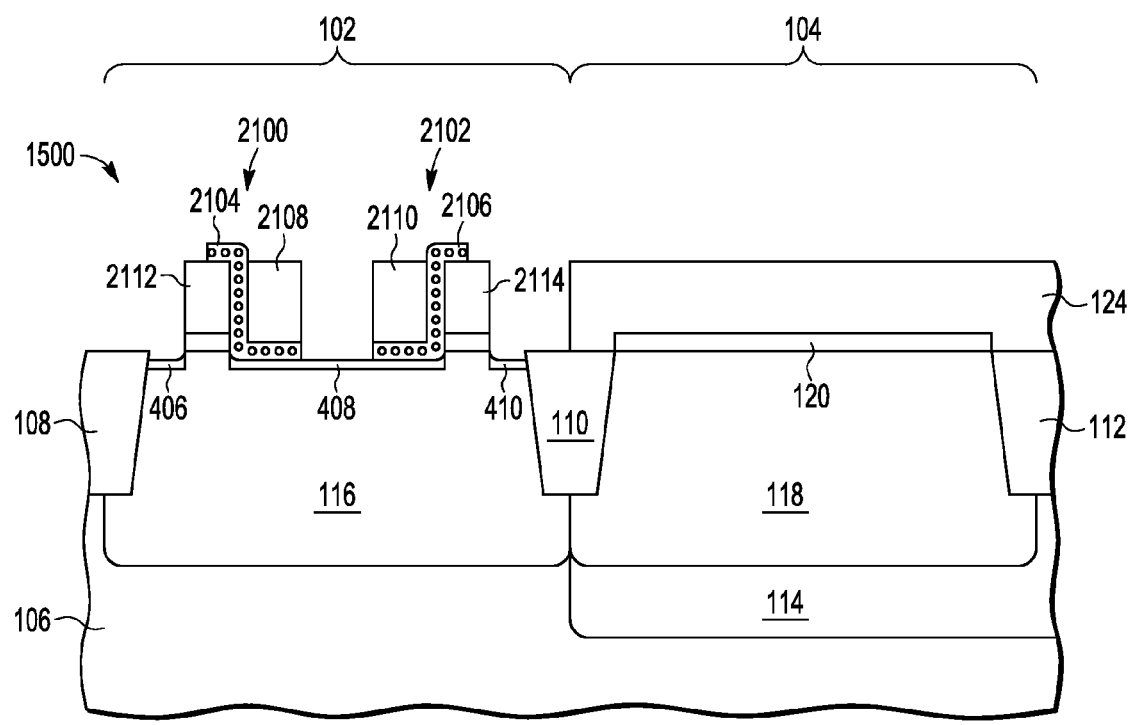
FIG. 21 is a cross section of the semiconductor structure of FIG. 20 at a subsequent stage in processing.

FIG. 21 is a cross section of the semiconductor structure 1500 of FIG. 20 at a subsequent stage in processing after a patterned etch has been performed to remove segments of charge storage layer 1802 (FIG. 20), while leaving charge storage portions 2104, 2106 between respective select gates 2112, 2114 and control gates 2108, 2110. Charge storage portions 2104, 2106 overlap the top of respective select gates 2112, 2114 and underlie control gates 2108, 2110 adjacent substrate 106 to form completed split gate NVM cells 2100, 2102. Subsequent processing of semiconductor structure 1500 to form logic and/or I/O devices, such as logic structure 1411 (FIG. 14), in logic portion 104 can follow the processes described herein for FIGS. 10 through 14.

Thus it is shown that metal gate transistors can be made in the presence of NVM cells, even if the NVM cells use nanocrystals, and further that the hard mask used during the metal etch can also subsequently be used in forming sidewall spacers used as an implant mask.

By now it should be appreciated that there has been provided a method of making a semiconductor device. In some embodiments, a method of making a semiconductor structure using a substrate (106) having a non-volatile memory (NVM) portion (102) and a logic portion (104), can comprise forming a select gate (400) over the substrate in the NVM portion and a first protection layer (120, 124, 128) over the logic portion, and forming a control gate (908, 2108) and a charge storage layer (1502) over the substrate in the NVM portion. A top surface of the control gate is substantially coplanar with a top surface of the select gate and the charge storage layer is under the control gate, along adjacent sidewalls of the select gate and control gate, is partially over the top surface of the select gate. A second protection layer is formed over the NVM portion and the logic portion. The second protection layer (1002) and the first protection layer are removed from the logic portion leaving a portion of the second protection layer over the control gate and the select gate. A gate structure 1200 is formed over the logic portion comprising a gate dielectric (1202) of high k material and a metal gate (1204) over the gate dielectric.

In another aspect, the forming the select gate can be further characterized by the select gate comprising polysilicon.

In another aspect, the forming the control gate and the charge storage layer can be further characterized by the control gate comprising polysilicon.

In another aspect, the forming the control gate and the charge storage layer can be further characterized by the charge storage layer comprising nanocrystals.

In another aspect, the method can further comprise forming a gate dielectric (122) prior to forming the select gate by growing thermal oxide on the substrate in the NVM portion, wherein the forming the select gate can be further characterized by the select gate being directly on the gate dielectric.

In another aspect, the method can further comprise depositing a conformal layer over NVM portion and the logic portion; and etching the conformal layer to leave a first sidewall spacer around the logic gate and second sidewall spacer around the control and select gate.

In another aspect, the method can further comprise performing an implant into the substrate using the first and second sidewall spacers as masks for the implant.

In another aspect, the forming the second protection layer comprises forming a first oxide layer, a nitride layer on the first oxide layer, and a second oxide layer on the nitride layer.

In another aspect, the step of forming the charge storage layer and the control gate can comprise depositing a layer comprising nanoncrystals over the NVM portion and the logic portion, forming a polysilicon layer (602) over the layer comprising nanocrystals, planarizing the polysilicon layer, and patterning the polysilicon layer and the layer comprising nanocrystals to form the control gate from the polysilicon layer and to form the layer of nanocrystals as the charge storage layer partially over the control gate.

In another aspect, the method can further comprise forming an optical patterning layer (128) over the select gate.

In another aspect, the method can further comprise recessing the polysilicon layer.

In another aspect, the forming the charge storage layer and the control gate can comprise forming a sacrificial layer over the NVM portion, planarizing the sacrificial layer, etching an opening in the sacrificial layer adjacent to the select gate, forming a layer comprising nanocrystals in the NVM portion including in the opening, along a sidewall of the select gate, and over the select gate, removing the sacrificial layer to leave a space adjacent to the layer comprising nanocrystals along the sidewall of the select gate, filling the opening with control gate material, and etching back the control gate material to form the control gate.

In another aspect, the forming the charge storage layer and the control gate can further comprise etching the layer of nanocrystals to leave the top surface of the select gate partially covered with the layer of nanocrystals.

In another embodiment, a method of making a semiconductor structure using a substrate (106) having a non-volatile memory (NVM) portion (102) and a logic portion (104), can comprise growing thermal oxide (122) on the substrate in the NVM portion, forming a select gate (400) in the NVM portion on the thermal oxide, counterdoping (418) the substrate in the NVM portion adjacent to the select gate, and forming a control gate (908, 2108) and a charge storage layer (1502) over the substrate in the NVM portion. A top surface of the control gate is substantially coplanar with a top surface of the select gate and the charge storage layer is under the control gate, along adjacent sidewalls of the select gate and control gate, is partially over the top surface of the select gate. A protective layer is formed over the NVM portion and the logic portion. The protective layer is removed from the logic portion. A gate structure is formed in the logic portion comprising a high k dielectric as a gate dielectric and a metal gate over the gate dielectric that sets a work function. A dielectric layer is deposited over the NVM portion and the logic portion. An etch of the dielectric layer is performed to form a first sidewall spacer around the select gate and the control gate, and a second sidewall spacer around the metal gate. An implant into the substrate is performed using the first and second sidewall spacers.

In another aspect, the forming the control gate and the charge storage layer can comprise depositing a layer comprising nanocrystals over the NVM portion and the logic portion; forming a polysilicon layer (602) over the layer comprising nanocrystals; planarizing the polysilicon layer; and patterning the polysilicon layer and the layer comprising nanocrystals to form the control gate from the polysilicon layer and to form the layer of nanocrystals as the charge storage layer partially over the control gate.

In another aspect, the method can further comprise planarizing the polysilicon layer; and recessing the polysilicon layer.

In another aspect, the forming the charge storage layer and the control gate can comprise forming a sacrificial layer over the NVM portion; planarizing the sacrificial layer; etching an opening in the sacrificial layer adjacent to the select gate; forming a layer comprising nanocrystals in the NVM portion including in the opening, along a sidewall of the select gate, and over the select gate; removing the sacrificial layer to leave a space adjacent to the layer comprising nanocrystals along the sidewall of the select gate; filling the opening with control gate material; and etching back the control gate material to form the control gate.

In another aspect, the forming the charge storage layer and the control gate can further comprise, prior to etching the opening, forming a liner in the opening.

In still another embodiment, a semiconductor structure (100) using a substrate (106) having a non-volatile memory (NVM) portion (112) and a logic portion (114), can comprise a select gate (124) comprising polysilicon over a thermal oxide layer (122) on the substrate in the NVM portion; a control gate (908) adjacent a first side of the select gate and having a top surface substantially coplanar with a top surface of the select gate; a charge storage layer (500, 1802) having a first portion between the control gate and the substrate, a second portion between the control gate and the first side of the select gate, and a third portion partially over the select gate; and a logic gate (1200) comprising metal over a high k dielectric (2602) over the substrate in the logic portion.

In another aspect, the top surfaces of the logic gate, the select gate, and the control gate are substantially coplanar.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different materials than those described may be found to be effective. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a semiconductor structure using a substrate having a non-volatile memory (NVM) portion and a logic portion, comprising:
   forming a select gate over the substrate in the NVM portion and a first protection layer over the logic portion;

forming a control gate and a charge storage layer over the substrate in the NVM portion, wherein a top surface of the control gate is substantially coplanar with a top surface of the select gate and the charge storage layer is under the control gate, along adjacent sidewalls of the select gate and control gate, is partially over the top surface of the select gate;

forming a second protection layer over the NVM portion and the logic portion;

removing the second protection layer and the first protection layer from the logic portion leaving a portion of the second protection layer over the control gate and the select gate; and forming a gate structure over the logic portion comprising a gate dielectric of high k material and a metal gate over the gate dielectric.

2. The method of claim 1, wherein the forming the select gate is further characterized by the select gate comprising polysilicon.

3. The method of claim 2, wherein the forming the control gate and the charge storage layer is further characterized by the control gate comprising polysilicon.

4. The method of claim 3, wherein the forming the control gate and the charge storage layer is further characterized by the charge storage layer comprising nanocrystals.

5. The method of claim 1, further comprising forming a gate dielectric prior to forming the select gate by growing thermal oxide on the substrate in the NVM portion, wherein the forming the select gate is further characterized by the select gate being directly on the gate dielectric.

6. The method of claim 1, further comprising:
depositing a conformal layer over NVM portion and the logic portion; and
etching the conformal layer to leave a first sidewall spacer around the logic gate and second sidewall spacer around the control and select gate.

7. The method of claim 6, further comprising performing an implant into the substrate using the first and second sidewall spacers as masks for the implant.

8. The method of claim 7, wherein the forming the second protection layer comprises forming a first oxide layer, a nitride layer on the first oxide layer, and a second oxide layer on the nitride layer.

9. The method of claim 1, wherein the step of forming the charge storage layer and the control gate comprises:
depositing a layer comprising nanoncrystals over the NVM portion and the logic portion;
forming a polysilicon layer over the layer comprising nanocrystals;
planarizing the polysilicon layer; and
patterning the polysilicon layer and the layer comprising nanocrystals to form the control gate from the polysilicon layer and to form the layer of nanocrystals as the charge storage layer partially over the control gate.

10. The method of claim 9, further comprising forming an optical patterning layer over the select gate.

11. The method of claim 9, further comprising recessing the polysilicon layer.

12. The method of claim 1, wherein the forming the charge storage layer and the control gate comprises:
forming a sacrificial layer over the NVM portion;
planarizing the sacrificial layer;
etching an opening in the sacrificial layer adjacent to the select gate;
forming a layer comprising nanocrystals in the NVM portion including in the opening, along a sidewall of the select gate, and over the select gate;

removing the sacrificial layer to leave a space adjacent to the layer comprising nanocrystals along the sidewall of the select gate;
filling the opening with control gate material; and
etching back the control gate material to form the control gate.

13. The method of claim 12, wherein the forming the charge storage layer and the control gate further comprises etching the layer of nanocrystals to leave the top surface of the select gate partially covered with the layer of nanocrystals.

14. A method of making a semiconductor structure using a substrate having a non-volatile memory (NVM) portion and a logic portion, comprising:
growing thermal oxide on the substrate in the NVM portion;
forming a select gate in the NVM portion on the thermal oxide;
counterdoping the substrate in the NVM portion adjacent to the select gate;
forming a control gate and a charge storage layer over the substrate in the NVM portion, wherein a top surface of the control gate is substantially coplanar with a top surface of the select gate and the charge storage layer is under the control gate, along adjacent sidewalls of the select gate and control gate, is partially over the top surface of the select gate;
forming a protective layer over the NVM portion and the logic portion;
removing the protective layer from the logic portion;
forming a gate structure in the logic portion comprising a high k dielectric as a gate dielectric and a metal gate over the gate dielectric that sets a work function;
depositing a dielectric layer over the NVM portion and the logic portion;
performing an etch of the dielectric layer to form a first sidewall spacer around the select gate and the control gate, and a second sidewall spacer around the metal gate; and
performing an implant into the substrate using the first and second sidewall spacers.

15. The method of claim 14, wherein the forming the control gate and the charge storage layer comprises:
depositing a layer comprising nanoncrystals over the NVM portion and the logic portion;
forming a polysilicon layer over the layer comprising nanocrystals;
planarizing the polysilicon layer; and
patterning the polysilicon layer and the layer comprising nanocrystals to form the control gate from the polysilicon layer and to form the layer of nanocrystals as the charge storage layer partially over the control gate.

16. The method of claim 15, further comprising:
planarizing the polysilicon layer; and
recessing the polysilicon layer.

17. The method of claim 14, wherein the forming the charge storage layer and the control gate comprises:
forming a sacrificial layer over the NVM portion;
planarizing the sacrificial layer;
etching an opening in the sacrificial layer adjacent to the select gate;
forming a layer comprising nanocrystals in the NVM portion including in the opening, along a sidewall of the select gate, and over the select gate;
removing the sacrificial layer to leave a space adjacent to the layer comprising nanocrystals along the sidewall of the select gate;
filling the opening with control gate material; and etching back the control gate material to form the control gate.

18. The method of claim 17, wherein the forming the change storage layer and the control gate further comprises, prior to etching the opening, forming a liner in the opening.

\* \* \* \* \*